United States Patent
Harmelink et al.

(10) Patent No.: US 8,867,210 B2
(45) Date of Patent: Oct. 21, 2014

(54) COOLING APPARATUS FOR AN ELECTRICAL SUBSTRATE

(71) Applicant: Deere & Company, Moline, IL (US)

(72) Inventors: Gregory K. Harmelink, Moorhead, MN (US); Christopher J. Schmit, Fargo, ND (US)

(73) Assignee: Deere & Company, Moline, IL (US)

( * ) Notice: Subject to any disclaimer, the term of this patent is extended or adjusted under 35 U.S.C. 154(b) by 121 days.

(21) Appl. No.: 13/664,823

(22) Filed: Oct. 31, 2012

(65) Prior Publication Data

US 2014/0118932 A1     May 1, 2014

(51) Int. Cl.
    *H05K 7/20*      (2006.01)
    *H01L 23/34*      (2006.01)
    *H01L 23/473*     (2006.01)

(52) U.S. Cl.
    CPC .......... *H05K 7/20254* (2013.01); *H01L 23/473* (2013.01); *H05K 7/20927* (2013.01)
    USPC ...... 361/699; 165/80.4; 165/104.33; 174/15.1; 257/714; 361/702; 361/721; 361/719

(58) Field of Classification Search
CPC .......... G06F 1/16–1/1654; G06F 1/1656; G06F 1/1662–1/1681; G06F 1/1684–1/189; G06F 1/20; G06F 1/203; G06F 1/206; G06F 2200/201; G06F 2200/202; G06F 2200/203; H05K 5/00; H05K 5/0026; H05K 5/0082; H05K 5/0021; H05K 5/0086–5/06; H05K 5/069; H05K 7/005–7/08; H05K 7/20; H05K 7/00; H05K 7/1422; H05K 1/0218–1/0219; H05K 1/00; H05K 3/00; H05K 9/00; H05K 7/2089–7/20945; H05K 7/20218; H05K 7/20254; H01G 2/00; H01G 4/00; H01G 5/00; H01G 7/00; H01G 9/00–9/155; H01G 11/00; H02G 3/00; H02G 5/00; H02G 7/00; H02G 9/00; H02G 11/00; H02G 13/00; H02G 15/00; H01B 7/00; H01B 11/00; H01B 17/00; H01R 4/00; H01R 9/00; H01R 13/00; H01K 1/00; H01K 3/00; H02B 1/00; H01H 37/00; H01L 23/473
USPC .......... 361/679.46–679.54, 688–723; 165/80.4–80.5, 104.33, 185; 174/15.1–15.3, 16.1–16.3, 547–548; 257/706–722
See application file for complete search history.

(56) References Cited

U.S. PATENT DOCUMENTS

| | | |
|---|---|---|
| 5,901,037 A | 5/1999 | Hamilton et al. |
| 6,105,662 A | 8/2000 | Suzuki |
| 6,816,381 B2 | 11/2004 | Takeuchi |

(Continued)

*Primary Examiner* — Zachary M Pape
*Assistant Examiner* — Razmeen Gafur

(57) ABSTRACT

A cooling apparatus is disclosed. The cooling apparatus comprises a first outer portion comprising a fluid inlet and a first exterior cooling surface. A first fluid-diverting structure is in fluid communication with the fluid inlet. A second outer portion comprises a fluid outlet and a second exterior cooling surface. A second fluid-diverting structure is in fluid communication with the fluid outlet. An electrical substrate is coupled to at least one of the first and second exterior cooling surfaces. An intermediate portion is in a facing relationship with the first and second outer portions. The intermediate portion defines an aperture for transferring a fluid between a first cavity and a second cavity. The first cavity is defined between the first outer portion and the intermediate portion. The second cavity is defined between the second outer portion and the intermediate portion. The fluid absorbs heat from the electrical substrate.

20 Claims, 7 Drawing Sheets

(56) References Cited

U.S. PATENT DOCUMENTS

| | | | |
|---|---|---|---|
| 6,909,607 B2 * | 6/2005 | Radosevich et al. | 361/702 |
| 6,988,534 B2 * | 1/2006 | Kenny et al. | 165/80.4 |
| 7,334,630 B2 | 2/2008 | Goodson et al. | |
| 7,633,758 B2 | 12/2009 | Oohama | |
| 7,830,689 B2 | 11/2010 | Nakamura et al. | |
| 7,876,563 B2 * | 1/2011 | Shiba | 361/699 |
| 7,952,875 B2 * | 5/2011 | Woody et al. | 361/699 |
| 7,952,879 B1 * | 5/2011 | Vinciarelli et al. | 361/704 |
| 7,978,468 B2 * | 7/2011 | Nakatsu et al. | 361/689 |
| 8,159,849 B2 * | 4/2012 | Nakajima et al. | 363/131 |
| 8,169,779 B2 * | 5/2012 | Le et al. | 361/689 |
| 2001/0035285 A1 | 11/2001 | Ognibene et al. | |
| 2005/0082037 A1 | 4/2005 | Thayer et al. | |
| 2008/0130223 A1 * | 6/2008 | Nakamura et al. | 361/689 |
| 2010/0053889 A1 * | 3/2010 | Miller et al. | 361/689 |
| 2010/0254089 A1 * | 10/2010 | Anderl et al. | 361/702 |
| 2010/0321889 A1 * | 12/2010 | Yoshino et al. | 361/702 |
| 2011/0096496 A1 * | 4/2011 | Doo et al. | 361/689 |

* cited by examiner

COOLING APPARATUS FOR AN ELECTRICAL SUBSTRATE

FIELD OF THE DISCLOSURE

The present disclosure generally relates to an apparatus and method for cooling an electrical substrate.

BACKGROUND OF THE DISCLOSURE

To cool an electrical substrate and the electrical components mounted thereto, certain prior art uses a heat sink or a housing with a heat sink for heat dissipation.

SUMMARY OF THE DISCLOSURE

In one embodiment, a cooling apparatus comprises a first outer portion comprising a fluid inlet and a first exterior cooling surface. A first fluid-diverting structure is in fluid communication with the fluid inlet. A second outer portion comprises a fluid outlet and a second exterior cooling surface. A second fluid-diverting structure is in fluid communication with the fluid outlet. An electrical substrate is coupled to at least one of the first exterior cooling surface and the second exterior cooling surface. An intermediate portion is in a facing relationship with the first outer portion and the second outer portion. The intermediate portion defines an aperture for transferring a fluid between a first cavity and a second cavity. The first cavity is defined between the first outer portion and the intermediate portion. The second cavity is defined between the second outer portion and the intermediate portion. The fluid is capable of being conveyed through the fluid inlet, the first fluid-diverting structure, the first cavity, the aperture, the second cavity, the second fluid-diverting structure, and the fluid outlet. The fluid absorbs heat from the electrical substrate.

In another embodiment, an electronic apparatus comprises a second inner electrical substrate that is coupled to the second exterior cooling surface. The fluid absorbs heat from the first exterior cooling surface and the second exterior cooling surface.

Other features and aspects will become apparent by consideration of the detailed description and accompanying drawings.

Before any embodiments are explained in detail, it is to be understood that the disclosure is not limited in its application to the details of construction and the arrangement of components set forth in the following description or illustrated in the following drawings. The disclosure is capable of other embodiments and of being practiced or of being carried out in various ways. Further embodiments of the invention may include any combination of features from one or more dependent claims, and such features may be incorporated, collectively or separately, into any independent claim. As defined herein, a substrate comprises a dielectric layer, a metallic layer of conductive traces, and one or more components, electrical devices, electronic devices, semiconductors (e.g., power semiconductors), inductors, capacitors, integrated circuits, or resistors.

DETAILED DESCRIPTION

Figure 1:
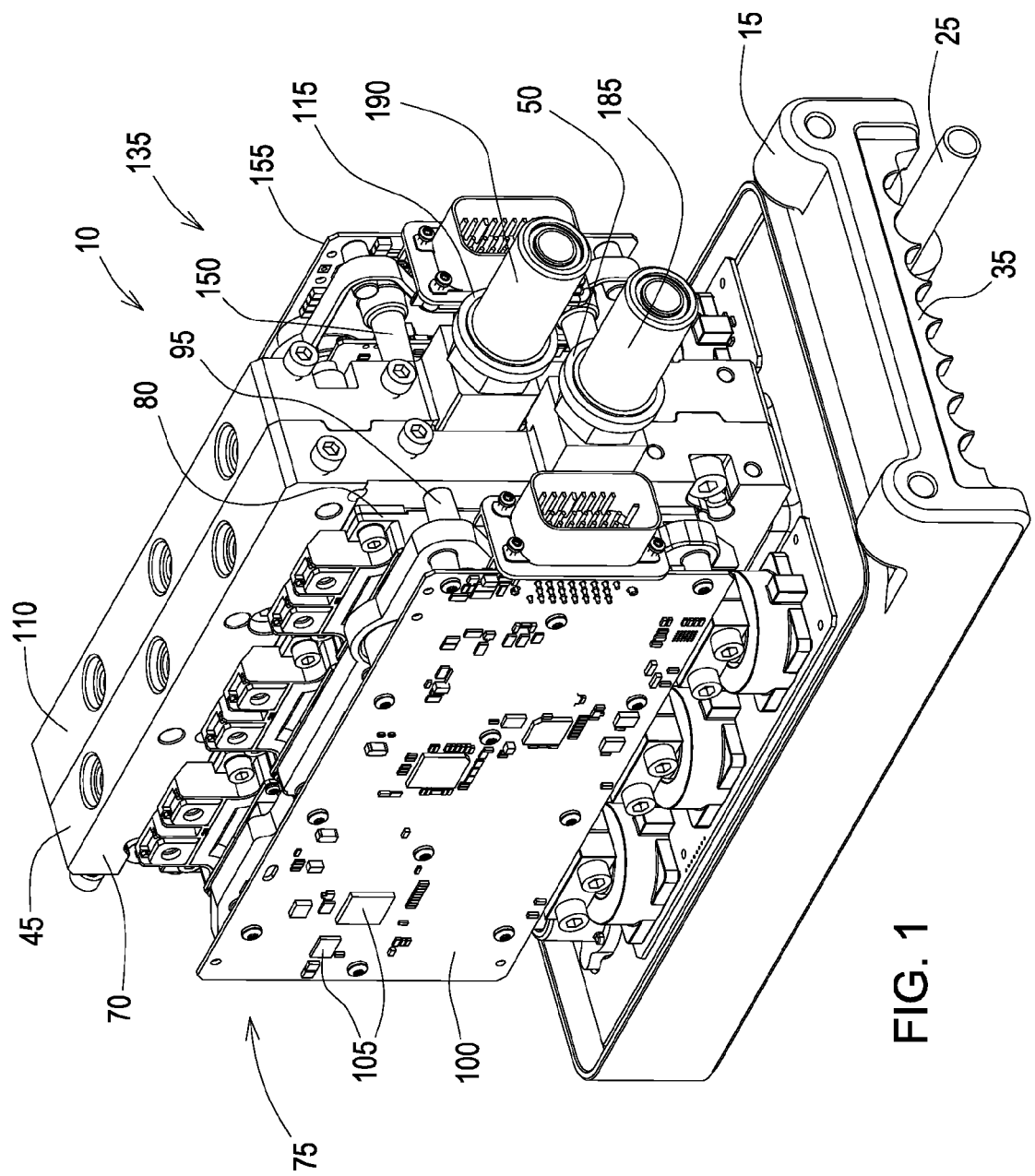
FIG. 1 is a top perspective view of a cooling apparatus according to one embodiment.

FIGS. 1-5 illustrate a cooling apparatus 10 for dissipating heat from an electronic assembly or an electrical device. Referring to FIG. 1, the illustrated cooling apparatus 10 comprises a support structure 15.

Figure 2:
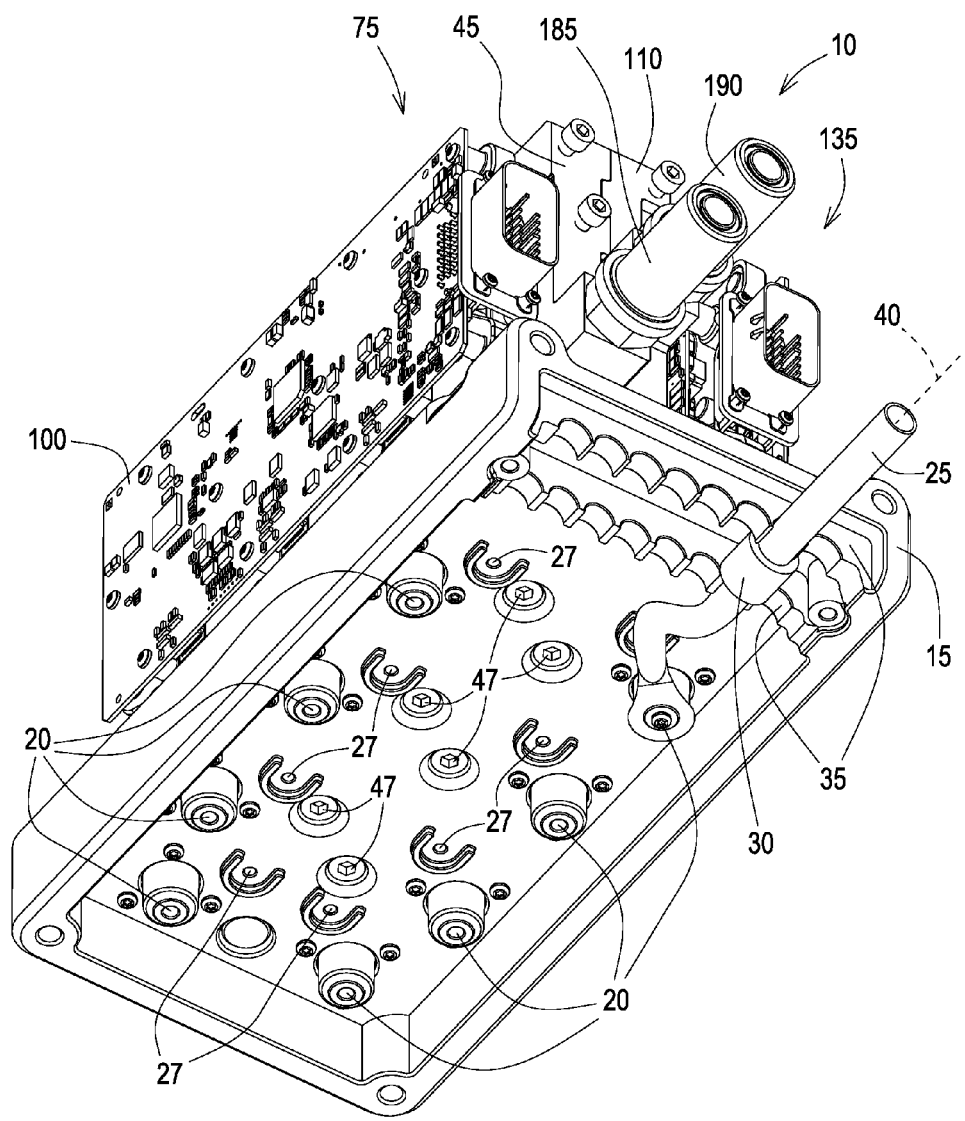
FIG. 2 is a bottom perspective view of the cooling apparatus shown in FIG. 1.

With reference to FIG. 2, the support structure 15 comprises a plurality of terminals 20 for coupling to a conductor 25. The conductor 25 may terminate in a terminal that is suitable for electrical and mechanical connection to respective terminal 20. Alternatively, the conductor 25 may be coupled to terminals 27. In one embodiment, the conductor 25 may comprise an insulated wire or cable with a dielectric grommet 30 or other protrusion. The dielectric grommet 30 may be positioned within a conductor strain relief structure 35. A cover (not shown) may be positioned over the terminals 20 and the conductor 25 to seal them from the ambient environment. The conductor strain relief structure 35 helps to reduce strain in the area where the conductor 25 is coupled to the terminal 20, 27 along a longitudinal axis 40 of the conductor 25. Strain along the longitudinal axis 40 is impeded by the conductor strain relief structure 35 contacting the dielectric grommet 30. This helps to ensure that the conductor 25 remains coupled to the terminal 20, 27.

Figure 3:
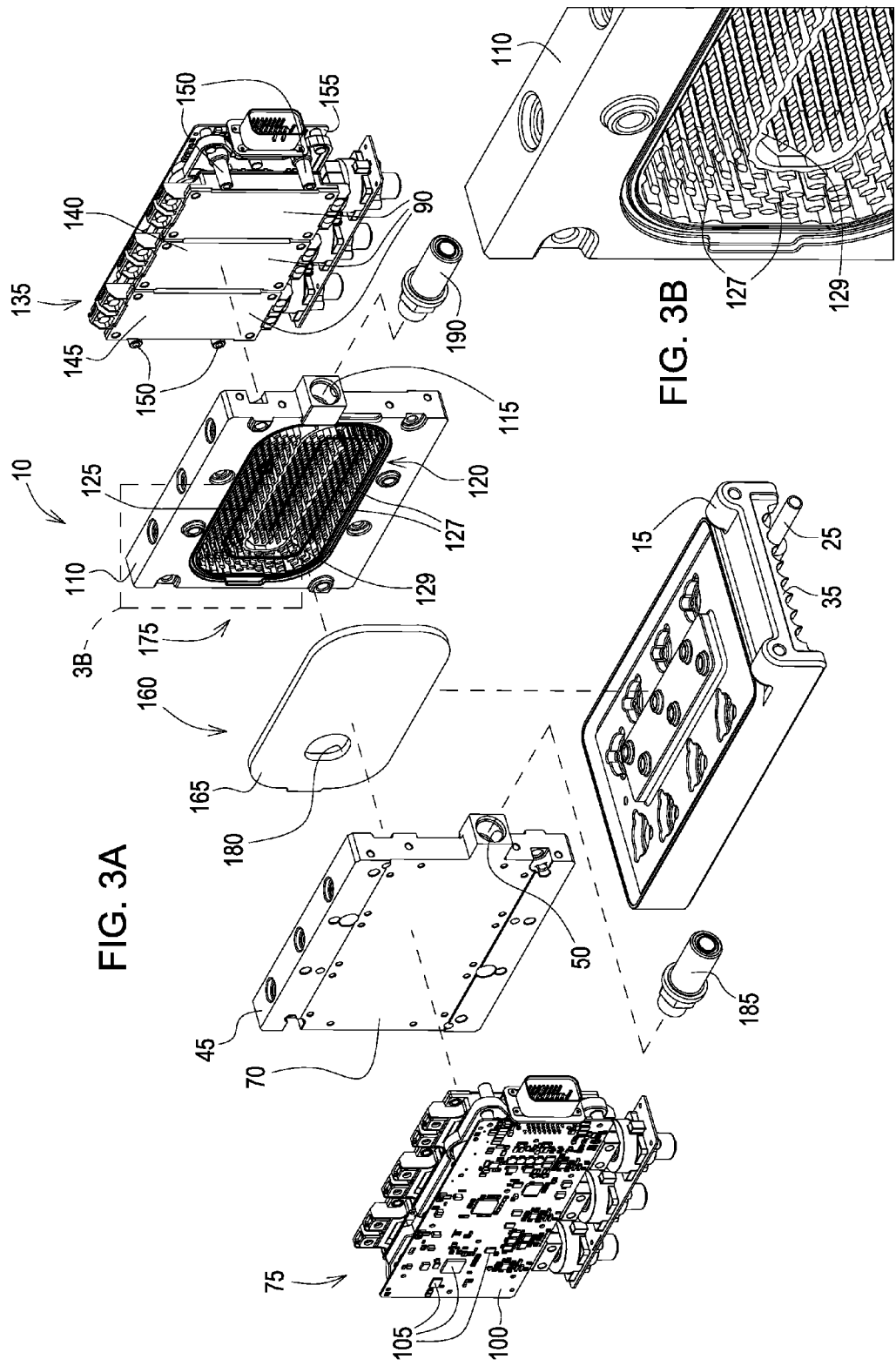
FIG. 3A is a partially exploded front view of the cooling apparatus shown in FIG. 1.
FIG. 3B is a zoomed in view of a portion of the cooling apparatus of FIG. 3A.
Figure 4:
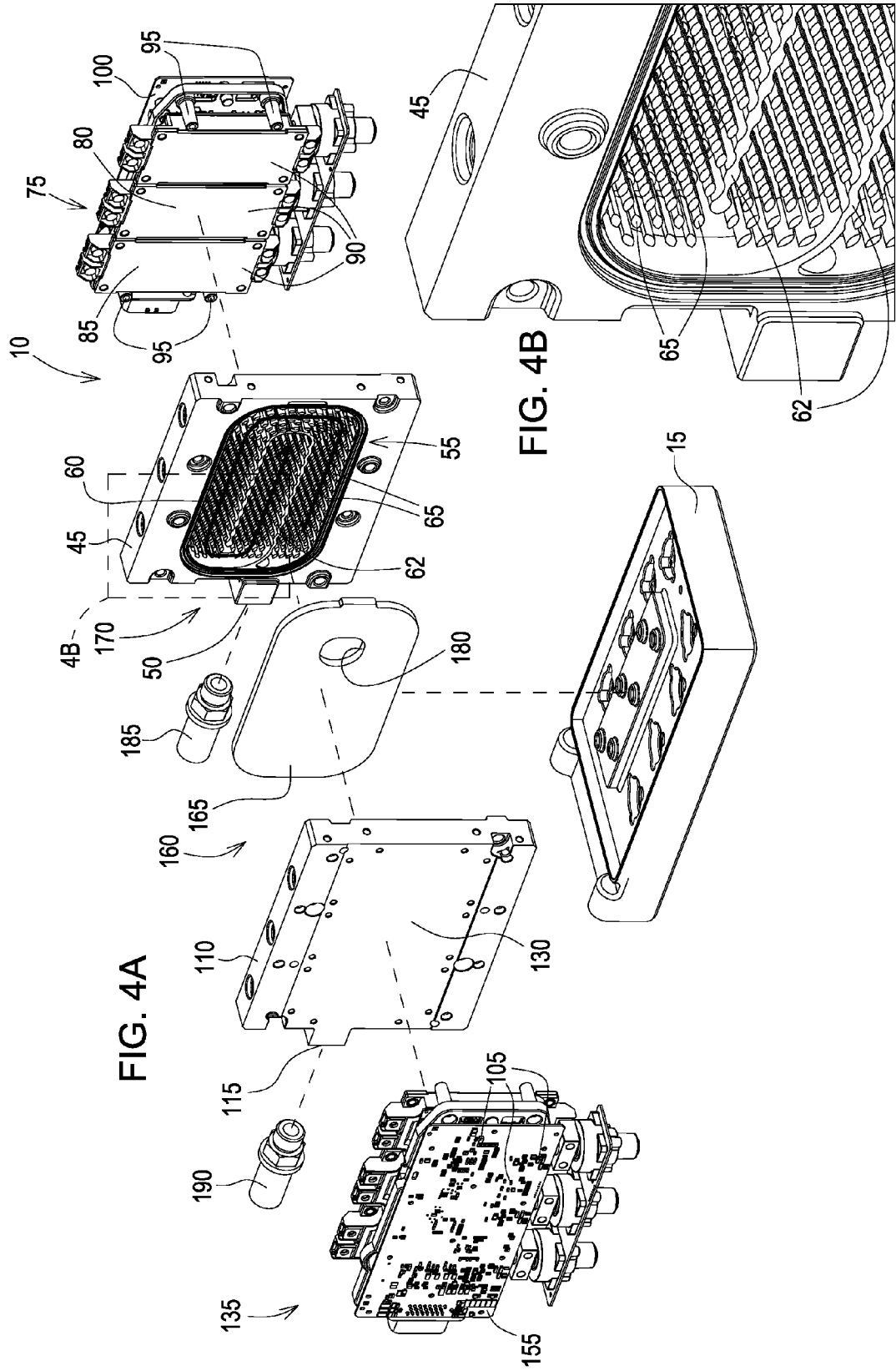
FIG. 4A is a partially exploded rear view of the cooling apparatus shown in FIG. 1.
FIG. 4B is a zoomed in view of a portion of the cooling apparatus of FIG. 4A.

Referring to FIGS. 3 and 4A, a first outer portion 45 is supported by the support structure 15. A plurality of fasteners 47 (FIG. 2) may be used to secure the first outer portion 45 to the support structure 15. The first outer portion 45 comprises a fluid inlet 50.

The first outer portion 45 comprises a first fluid-diverting structure 55. The first fluid-diverting structure 55 is in fluid communication with the fluid inlet 50 for receiving a fluid therefrom. The fluid may be composed of one or more of the following: water, alcohol, ethylene glycols, propylene glycol, antifreeze, an aqueous solution, a thermally-conductive oil-based solution, refrigerant, fluorocarbon oil, oil, or other type of coolant. With reference to FIG. 4A, the first fluid-diverting structure 55 may define a first spiral fluid path 60. The first fluid-diverting structure 55 may comprise a plurality of flow diverters 65. Referring to FIG. 4B, the first spiral fluid path 60, as shown by the arrow (FIG. 4A), may be defined, partially or completely, by a curved wall 62 and is configured to divert the fluid in a generally curved pattern or spiral pattern (e.g., spiral, skewed spiral, curved). The flow diverters 65 (e.g., protrusions, cylindrical members, channels with fins, or other cooling features) may be positioned along the first spiral fluid path 60 to facilitate heat transfer. In one embodiment, each flow diverter 65 may have a generally cylindrical shape or a generally elliptical cross-section. In an alternate embodiment, one or more curved walls or labyrinths may direct the flow of fluid in a generally spiral pattern.

Referring to FIG. 3A, the first outer portion 45 comprises a first exterior cooling surface 70. A first electrical substrate 75

(e.g., circuit board) may be mechanically coupled to the first exterior cooling surface 70. In one embodiment, the first exterior cooling surface 70 may be at ground potential and electrically coupled to a ground connection of the substrate 75.

With reference to FIG. 4A, the first electrical substrate 75 may comprise a first inner electrical substrate 80 coupled to the first exterior cooling surface 70 (FIG. 3). The first inner electrical substrate 80 may comprise a metal layer 85 that contacts the first exterior cooling surface 70 (e.g., at ground potential) to facilitate heat transfer. Additionally or alternatively, a thermally-conductive adhesive 90 may be applied between the first inner electrical substrate 80 and the first exterior cooling surface 70 to facilitate heat transfer and to adhesively bond the first inner electrical substrate 80 and the first exterior cooling surface 70.

A first spacer 95 may be applied between the first inner electrical substrate 80 and the first exterior cooling surface 70 to facilitate heat dissipation to the ambient environment. The first spacer 95 may comprise metal or other thermally-conductive material to facilitate heat transfer.

A first outer electrical substrate 100 may be coupled to the first spacer 95. Referring to FIG. 3A, electrical components 105 (e.g., power semiconductors) may be coupled to the first outer electrical substrate 100 and the first inner electrical substrate 80 (FIG. 4A).

A second outer portion 110 is supported by the support structure 15. A plurality of fasteners 47 (FIG. 2) may be used to secure the second outer portion 110 to the support structure 15. The second outer portion 110 comprises a fluid outlet 115.

The second outer portion 110 comprises a second fluid-diverting structure 120. The second fluid-diverting structure 120 is in fluid communication with the fluid outlet 115 for transferring the fluid thereto. The second fluid-diverting structure 120 may define a second spiral fluid path 125. The second fluid-diverting structure 120 may comprise a plurality of flow diverters 127. With reference to FIG. 3B, the second spiral fluid path 125, as shown by the arrow (FIG. 3A), may be defined, partially or completely, by a curved wall 129 and is configured to divert the fluid in a generally curved pattern or spiral pattern (e.g., spiral, skewed spiral, curved). The flow diverters 127 (e.g., protrusions, cylindrical members, channels with fins, or other cooling features) may be positioned along the second spiral fluid path 125 to facilitate heat transfer. In one embodiment, each flow diverter 127 may have a generally cylindrical shape or a generally elliptical cross-section. In an alternate embodiment, one or more curved walls or labyrinths may direct the flow of fluid in a generally spiral pattern.

With reference to FIG. 4A, the second outer portion 110 comprises a second exterior cooling surface 130. A second electrical substrate 135 (e.g., circuit board) may be coupled to the second exterior cooling surface 130.

Referring to FIG. 3A, the second electrical substrate 135 may comprise a second inner electrical substrate 140 coupled to the second exterior cooling surface 130 (FIG. 4A). The second inner electrical substrate 140 may comprise a metal layer 145 that contacts the second exterior cooling surface 130 (e.g., at ground potential) to facilitate heat dissipation to the ambient environment. Additionally or alternatively, the thermally-conductive adhesive 90 may be applied between the second inner electrical substrate 140 and the second exterior cooling surface 130 to facilitate heat transfer and to adhesively bond the second inner electrical substrate 140 and the second exterior cooling surface 130.

A second spacer 150 may be applied between the second inner electrical substrate 140 and the second exterior cooling surface 130 to facilitate thermal dissipation to the ambient environment. The second spacer 150 may comprise metal or other thermally-conductive material to facilitate heat transfer.

A second outer electrical substrate 155 may be coupled to the second spacer 150. With reference to FIG. 4A, electrical components 105 (e.g., power semiconductors) may be coupled to the second outer electrical substrate 155 and the second inner electrical substrate 140 (FIG. 3A).

An intermediate portion 160 is in a facing relationship with the first outer portion 45 and the second outer portion 110. The first outer portion 45, the intermediate portion 160, and the second outer portion 110 may be secured together using a plurality of fasteners or by other techniques. The intermediate portion 160 may comprise a generally planar gasket 165 (e.g., elastic, deformable, metal, synthetic polymer, rubber, or elastomer).

A first cavity 170 is defined between the first outer portion 45 and the intermediate portion 160. Referring to FIG. 3A, a second cavity 175 is defined between the second outer portion 110 and the intermediate portion 160.

The intermediate portion 160 defines an aperture 180 for transferring the fluid between the first cavity 170 (FIG. 4A) and the second cavity 175. Alternatively, a plurality of apertures 180 may be defined. The aperture 180 may be centrally disposed.

With reference to FIGS. 1-4, a first coupler 185 is coupled to the fluid inlet 50 to provide the fluid to the cooling apparatus 10. A second coupler 190 is coupled to the fluid outlet 115 to receive the fluid from the cooling apparatus 10. In one embodiment, the first and second couplers 185, 190 are secured to the fluid inlet 50 or fluid outlet 115 via compression fittings or mating threads of the first and second coupler 185, 190 and the fluid inlet and outlet 50, 115.

Figure 5:
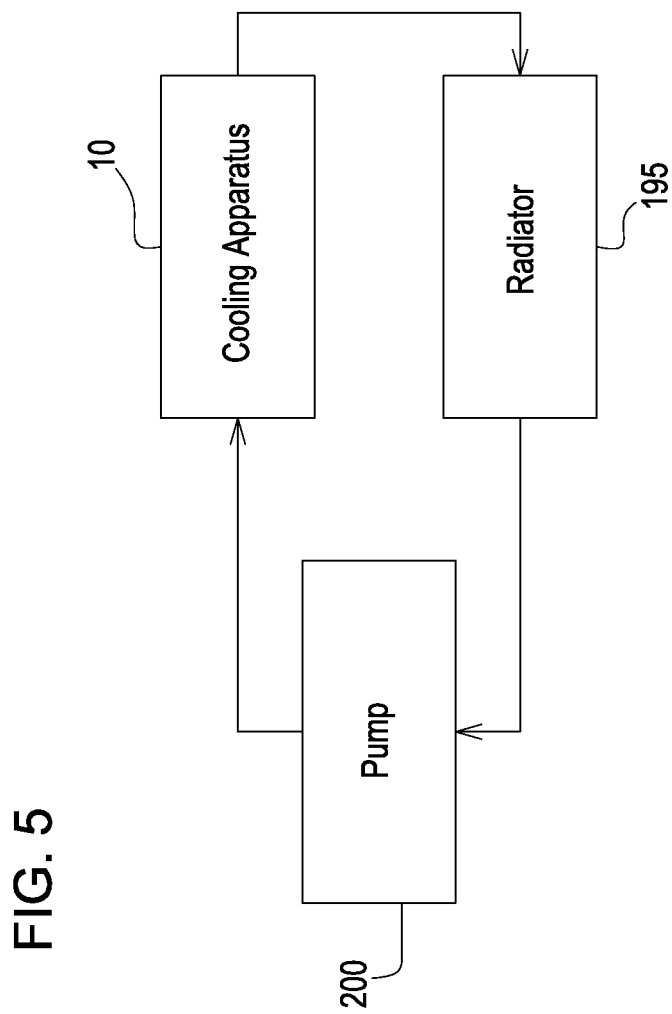
FIG. 5 is a schematic of an illustrative system incorporating the cooling apparatus shown in FIG. 1.

Referring to FIG. 5, after the heated fluid enters the second coupler 190 (FIG. 1) of the cooling apparatus 10, the heated fluid is received by a radiator 195, or other apparatus, for removing heat from the fluid. The cooled fluid is then received by a pump 200 that returns the cooled fluid to the first coupler 185 (FIG. 1) of the cooling apparatus 10 such that the cooled fluid can absorb and transfer heat from its path through the first cavity 170 (FIG. 4A) and the second cavity 175 (FIG. 3A).

In operation, the fluid is capable of being conveyed in first and second spiral fluid paths 60, 125 through the fluid inlet 50, the first fluid-diverting structure 55, the first cavity 170, the aperture 180, the second cavity 175, the second fluid-diverting structure 120, and the fluid outlet 115. The fluid supports dissipation of heat from the first and second electrical substrates 75, 135, where the fluid absorbs the heat during circulation through the first cavity 170 and the second cavity 175.

In another embodiment, a method for cooling a first and second electrical substrate 75, 135 comprises directing a flow of fluid through a fluid inlet 50 of a first outer portion 45. The flow of fluid is diverted through a first fluid-diverting structure 55 of the first outer portion 45 to dissipate heat from a first inner electrical substrate 80 coupled to a first exterior cooling surface 70 of the first outer portion 45. The flow of fluid is directed through a first cavity 170 defined between the first outer portion 45 and an intermediate portion 160. The flow of fluid is transferred from the first cavity 170 through an aperture 180 defined by the intermediate portion 160 to a second cavity 175 defined between a second outer portion 110 and the intermediate portion 160. The flow of fluid is diverted through a second fluid-diverting structure 120 of the second outer portion 110 to dissipate heat from a second inner electrical substrate 140 coupled to a second exterior cooling surface 130 of the second outer portion 110. The flow of fluid is directed through a fluid outlet 115 of the second outer portion 110.

Figure 6:
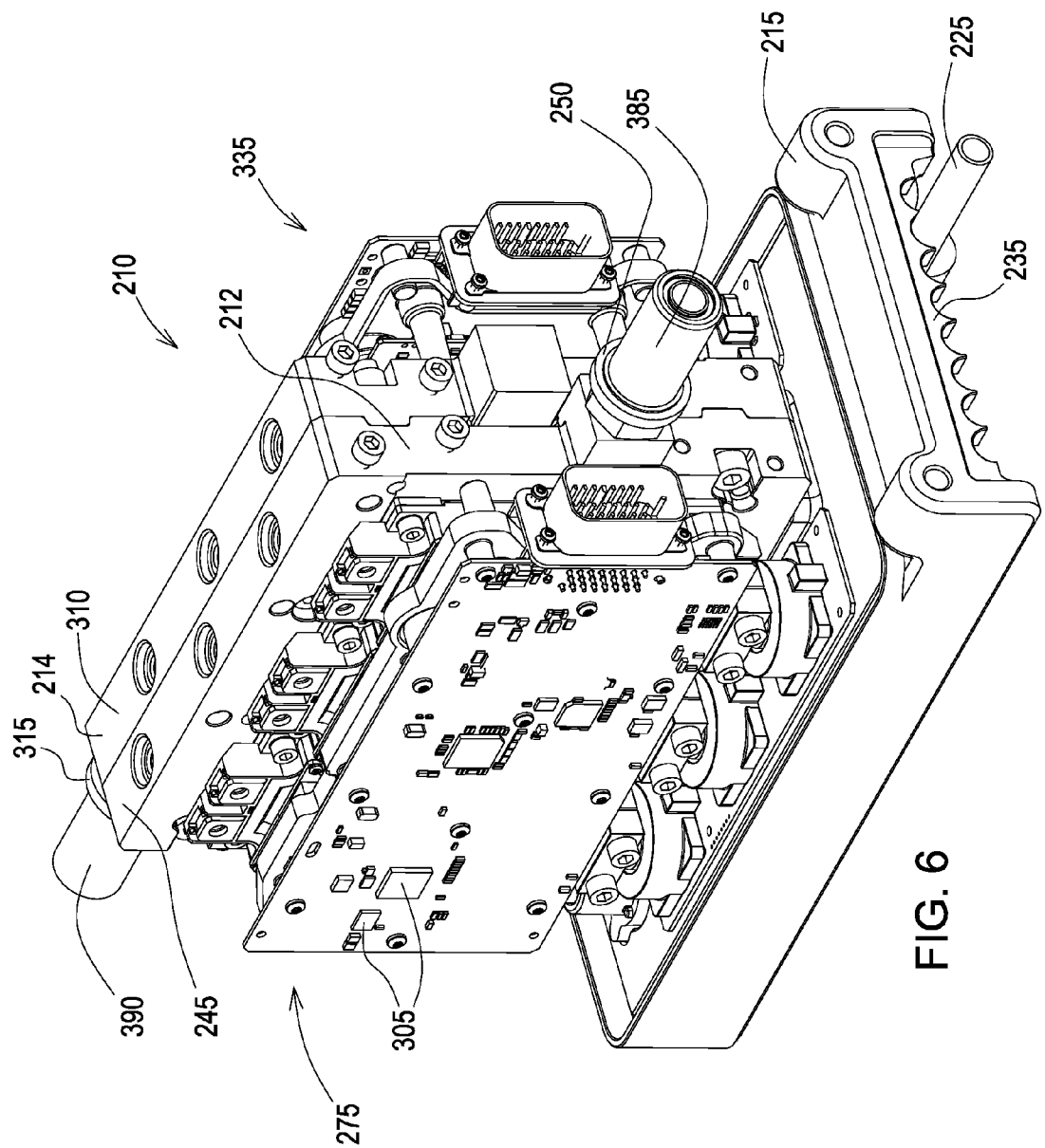
FIG. 6 is a top perspective view of a cooling apparatus according to another embodiment.

FIG. 6 illustrates a cooling apparatus 210 according to yet another embodiment. The cooling apparatus 210 includes features similar to the cooling apparatus 10 of FIGS. 1-5 and therefore, like components have been given like reference numbers plus 200 and only differences between the cooling apparatuses 10 and 210 will be discussed in detail below.

A first outer portion 245 comprises a fluid inlet 250. The fluid inlet 250 is positioned on a first side 212 of the cooling apparatus 210.

A second outer portion 310 comprises a fluid outlet 315. The fluid outlet 315 is positioned on a second side 214, opposite of the first side 212, of the cooling apparatus 210. Positioning the fluid outlet 315 opposite of the fluid inlet 250 reduces the pre-heating of the cooled fluid entering the cooling apparatus 210 to increase the efficiency of thermal heat dissipation. The cooling apparatus disclosed in this document is well suited for dissipating heat generated by components or electrical devices mounted on one or more substrates of an electronic assembly (e.g., an inverter, motor, or electronic controller). Further the dual spiral path, with or without internal protrusions or fins, supports or facilitates efficient thermal dissipation of heat generated by components or electric devices of substrates via the fluid.

Figure 7:
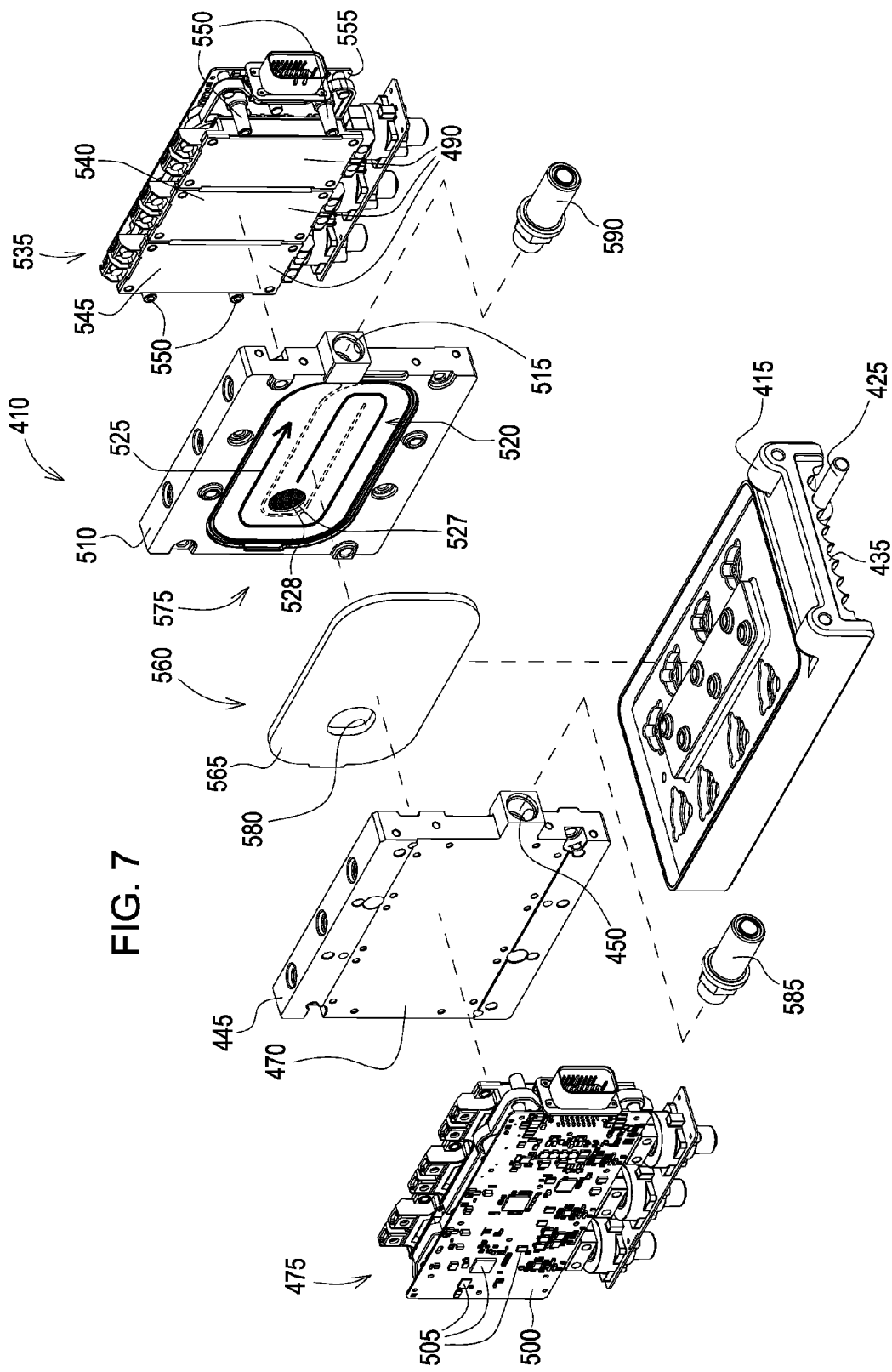
FIG. 7 is a partially exploded front view of a cooling apparatus according to yet another embodiment.

FIG. 7 illustrates a cooling apparatus 410 according to yet another embodiment. The cooling apparatus 410 includes features similar to the cooling apparatus 10 of FIGS. 1-5 and therefore, like components have been given like reference numbers plus 400 and only differences between the cooling apparatuses 10 and 410 will be discussed in detail below.

A first outer portion 445 comprises a first fluid-diverting structure 455. A second outer portion 510 comprises a second fluid-diverting structure 520. The first and second fluid-diverting structures 455, 520 may define a first and second spiral fluid path 460, 525, respectively. The first and second fluid-diverting structures 455, 520 may comprise a plurality of flow diverters 465, 527, respectively. The plurality of flow diverters 465, 527 may comprise microchannels 528.

Various features are set forth in the following claims.

What is claimed is:

1. A cooling apparatus comprising:
a first outer portion comprising a fluid inlet, a first exterior cooling surface, and a first fluid-diverting structure in fluid communication with the fluid inlet;
a second outer portion comprising a fluid outlet, a second exterior cooling surface, and a second fluid-diverting structure in fluid communication with the fluid outlet;
an electrical substrate coupled to at least one of the first exterior cooling surface and the second exterior cooling surface; and
an intermediate portion in a facing relationship with the first outer portion and the second outer portion, the intermediate portion defining an aperture for transferring a fluid between a first cavity and a second cavity, the first cavity defined between the first outer portion and the intermediate portion, the second cavity defined between the second outer portion and the intermediate portion;
wherein the fluid is capable of being conveyed through the fluid inlet, the first fluid-diverting structure, the first cavity, the aperture, the second cavity, the second fluid-diverting structure, and the fluid outlet, to dissipate heat from the electrical substrate.

2. The cooling apparatus of claim 1, wherein the intermediate portion comprises a generally planar gasket, wherein the aperture is centrally disposed.

3. The cooling apparatus of claim 1, wherein the first fluid-diverting structure defines a first spiral fluid path configured to divert the fluid in a generally spiral pattern to the aperture and the second fluid-diverting structure defines a second spiral fluid path configured to divert the fluid in a generally spiral pattern to the fluid outlet.

4. The cooling apparatus of claim 3, wherein the first spiral fluid path is defined, partially or completely, by a curved wall and the second spiral fluid path is defined, partially or completely, by a curved wall.

5. The cooling apparatus of claim 1, wherein the electrical substrate comprises a first inner electrical substrate coupled to the first exterior cooling surface.

6. The cooling apparatus of claim 5, further comprising a first spacer coupled to the first inner electrical substrate and a first outer electrical substrate coupled to the first spacer.

7. The cooling apparatus of claim 1, wherein the electrical substrate comprises a second inner electrical substrate coupled to the second exterior cooling surface.

8. The cooling apparatus of claim 7, further comprising a second spacer coupled to the second inner electrical substrate and a second outer electrical substrate coupled to the second spacer.

9. The cooling apparatus of claim 1, further comprising a support structure configured to support the first outer portion and the second outer portion.

10. The cooling apparatus of claim 9, wherein the support structure comprises a terminal and defines a conductor strain relief structure, the terminal configured to receive a conductor that is in electrical communication with the electrical substrate, the conductor strain relief structure configured to reduce strain on the conductor.

11. The cooling apparatus of claim 1, wherein the first fluid-diverting structure and the second fluid-diverting structure comprise a flow diverter configured to facilitate heat transfer with the fluid.

12. An electronic apparatus comprising:
a first outer portion comprising a fluid inlet, a first exterior cooling surface, and a first fluid-diverting structure in fluid communication with the fluid inlet;
a first inner electrical substrate coupled to the first exterior cooling surface;
a second outer portion comprising a fluid outlet, a second exterior cooling surface, and a second fluid-diverting structure in fluid communication with the fluid outlet;
a second inner electrical substrate coupled to the second exterior cooling surface; and
an intermediate portion in a facing relationship with the first outer portion and the second outer portion, the intermediate portion defining an aperture for transferring a fluid between a first cavity and a second cavity, the first cavity defined between the first outer portion and the intermediate portion, the second cavity defined between the second outer portion and the intermediate portion;
wherein the fluid is capable of being conveyed through the fluid inlet, the first fluid-diverting structure, the first cavity, the aperture, the second cavity, the second fluid-diverting structure, and the fluid outlet, to dissipate heat from the first exterior cooling surface and the second exterior cooling surface.

13. The electronic apparatus of claim 12, wherein the first inner electrical substrate and the second inner electrical substrate each comprise a metal layer that contacts the first exterior cooling surface and second exterior cooling surface, respectively, to facilitate heat transfer.

14. The electronic apparatus of claim 12, further comprising a thermally-conductive adhesive applied between the first inner electrical substrate and the first exterior cooling surface and between the second inner electrical substrate and the second exterior cooling surface to facilitate heat transfer and to adhesively bond the first and second inner electrical substrates to the respective first and second exterior cooling surfaces.

15. The electronic apparatus of claim 12, further comprising a spacer applied between the first inner electrical substrate and the first exterior cooling surface and between the second inner electrical substrate and the second exterior cooling surface to facilitate heat transfer.

16. The electronic apparatus of claim 15, wherein the spacer comprises a metal.

17. The electronic apparatus of claim 12, wherein the intermediate portion comprises a generally planar gasket.

18. The electronic apparatus of claim 12, wherein the first fluid-diverting structure defines a first spiral fluid path configured to divert the fluid in a generally spiral pattern to the aperture and the second fluid-diverting structure defines a second spiral fluid path configured to divert the fluid in a generally spiral pattern to the fluid outlet.

19. The electronic apparatus of claim 12, further comprising a support structure configured to support the first outer portion and the second outer portion.

20. A method for cooling an electrical substrate, the method comprising:
 directing a flow of fluid through a fluid inlet of a first outer portion;
 diverting the flow of fluid through a first fluid-diverting structure of the first outer portion to dissipate heat from a first inner electrical substrate coupled to a first exterior cooling surface of the first outer portion;
 directing the flow of fluid through a first cavity defined between the first outer portion and an intermediate portion;
 transferring the flow of fluid from the first cavity through an aperture defined by the intermediate portion to a second cavity defined between a second outer portion and the intermediate portion;
 diverting the flow of fluid through a second fluid-diverting structure of the second outer portion to dissipate heat from a second inner electrical substrate coupled to a second exterior cooling surface of the second outer portion; and
 directing the flow of fluid through a fluid outlet of the second outer portion.

* * * * *